United States Patent
Tseng et al.

(10) Patent No.: US 6,503,374 B1
(45) Date of Patent: Jan. 7, 2003

(54) SBTN FERROELECTRIC THIN FILM AND METHOD FOR PRODUCING SAME

(75) Inventors: Tseung-Yuen Tseng, Hsinchu (TW); Ming Shiahn Tsai, Tainan (TW); Huei-Mei Tsai, Taoyuan (TW); Pang Lin, Hsinchu (TW)

(73) Assignee: National Science Council, Taipei (TW)

( * ) Notice: Subject to any disclaimer, the term of this patent is extended or adjusted under 35 U.S.C. 154(b) by 128 days.

(21) Appl. No.: 09/650,377

(22) Filed: Aug. 29, 2000

(51) Int. Cl.[7] .............................................. C23C 14/34
(52) U.S. Cl. ................................ 204/192.15; 427/372.2
(58) Field of Search ....................... 204/192.15, 192.22; 427/372.2

(56) References Cited

U.S. PATENT DOCUMENTS

| | | | |
|---|---|---|---|
| 5,426,075 A | 6/1995 | Perino et al. | ................ 437/235 |
| 5,519,566 A | 5/1996 | Perino et al. | ............ 361/321.4 |
| 5,683,614 A | 11/1997 | Boyle | ..................... 252/629 R |

OTHER PUBLICATIONS

Park et al., "Influence of second phases on the ferroelectric properties of SrBi2TaNbO9 thin films fabricated by radio–frequency magnetron sputterng", J. Vac. Sci. Technol. A 18(1), Jan./Feb. 2000, p. 17–22.*

Tsai et al., "Effect of bismuth content on the properties of Sr0.8BixTa1.2Nb0.9O9+y ferroelectric thin films", J. App. Phys. vol. 85, No. 2, Jan. 15, 1999, p. 1095–1100.*

* cited by examiner

*Primary Examiner*—Steven H. VerSteeg
(74) *Attorney, Agent, or Firm*—Alston & Bird LLP

(57) ABSTRACT

A novel SBTN ($Sr_aBi_bTa_cNb_dO_x$) thin film which exhibits satisfactory ferroelectric properties is disclosed, wherein a lies between 0.5 and 1, b lies between 2 and 2.7, c lies between 1 and 1.4, d lies between 0.6 and 1.1, and x lies between 8 and 10. The composition of $Sr_{0.8}Bi_{2.5}Ta_{1.2}Nb_{0.9}O_x$ wherein x lies between 9 and 10 is preferred. The $Sr_{0.8}Bi_{2.5}Ta_{1.2}Nb_{0.9}O_x$ thin film is formed by two-target off-axis RF magnetron sputtering at a temperature down to about 600° C. One target is formed of $Sr_{0.8}Bi_{2.2}Ta_{1.2}Nb_{0.8}O_9$, and the other target is formed of $Bi_2O_3$.

13 Claims, 2 Drawing Sheets

SBTN FERROELECTRIC THIN FILM AND METHOD FOR PRODUCING SAME

FIELD OF THE INVENTION

The present invention relates to a ferroelectric thin film, and more particularly to an SBTN ferroelectric thin film. The present invention also relates to the use of an SBTN ferroelectric thin film and a method for producing an SBTN ferroelectric thin film.

BACKGROUND OF THE INVENTION

Recently, with the reduction of a sub-micron semiconductor device from VLSI to ULSI, the structure of a nonvolatile memory (NVRAM) is simplified to resemble a dynamic random access memory (DRAM) which consists of only one transistor and one capacitor. For this purpose, a thin film with ferroelectric properties is used as a component of the capacitor. Owing to the extremely high dielectric constant of a ferroelectric material, a ferroelectric random access memory (FRAM) cincluding a ferroelectric thin film as the component of the capacitor has advantages of reduced size, high speed, low operational voltage, low consumption power, low cost, and simple manufacturing procedure, compared to conventional NVRAMs.

At an early stage, lead zirconate titanate (PZT, i.e., $Pb(Zr_xTi_{1-x})O_3$) is a popular ferroelectric material. PZT, although exhibits remanent polarization, is subject to a fatigue effect. The fatigue effect results from the deficiency of oxygen in the structure of the PZT crystal. Although an oxide electrode can be used to solve this problem, the relatively high resistivity of the oxide electrode will render an undesired RC delay effect. Moreover, the oxide electrode is likely to produce a secondary phase which is non-ferroelectric during the growth of the PZT film. Therefore, the conditions for forming a PZT film is difficult to be controlled.

Recent investigations have examined the feasibility of alternative materials such as bismuth layered oxides having a perovskite-like layertype structure to substitute for the PZT film. For example, $SrBi_2Ta_2O_9$ (SBT) is used as a fatigue-free material displaying nearly no change (less than 5%) in remanent polarization up to $10^{12}$ switching cycles with Pt electrodes. Owing to the characteristics of resistance to fatigue, these layered bismuth oxides are considered so far as the optimum material for NVRAM applications.

Commercialization of nonvalitile FRAM technology based on SBT, however, has been hampered by problems related to a high processing temperature (>750° C.), low remanent polarization (2Pr), and low Curie temperature (Tc), thereby making the direct integration thereof into high density CMOS devices difficult. In general, the difficulty to reduce the post-deposition annealing temperature of SBT thin films was largely attributed to poor ferroelectric properties at an annealing temperature lower than 700° C.

Boyle, U.S. Pat. No. 5,683,614 filed Aug. 16, 1996 and incorporated herein for reference, discloses a sol-gel type synthesis of SBT thin films wherein SBT is thermally processed in the presence of oxygen to impart ferroelectric properties to the resulting thin film. Perino et al., U.S. Pat. Nos. 5,426,075 filed Jun. 15, 1994 and 5,519,566 filed Mar. 14, 1995, and both incorporated herein for reference, disclose a two-sputtering-target method to form an SBT thin film at low temperature, and the SBT thin film is then thermally processed in the sputtering chamber to obtain ferroelectric properties. By observing the ferroelectric property data of the resulting SBT thin film, e.g., the remanent polarization (2Pr) of 10 $\mu C/cm^2$, coercive field (2Ec) of 100 kV/cm, it is apparent that the dielectric constant is a little too low and the operational voltage is a little too high.

SUMMARY OF THE INVENTION

Therefore, an object of the present invention is to provide an SBTN ferroelectric thin film with improved ferroelectric properties.

Another object of the present invention is to provide the use of a specified composition of SBTN ferroelectric thin film in a semiconductor device as a dielectric film.

A further object of the present invention is to provide a method for producing an SBTN ferroelectric thin film, which can be performed at a relatively low processing temperature.

According to a first aspect of the present invention, an SBTN ferroelectric thin film having a composition of $Sr_aBi_bTa_cNb_dO_x$ is provided, wherein a lies between 0.5 and 1, preferably, a=0.8; b lies between 2 and 2.7, preferably, b=2.5; c lies between 1 and 1.4, preferably, c=1.2; d lies between 0.6 and 1.1, preferably, d=0.9; and x lies between 8 and 10, preferably x=9~10.

According to a second aspect of the present invention, the use of a $Sr_aBi_bTa_cNb_dO_x$ ferroelectric thin film as a dielectric film in a semiconductor device is provided, wherein a lies between 0.5 and 1, preferably, a=0.8; b lies between 2 and 2.7, preferably, b=2.5; c lies between 1 and 1.4, preferably, c=1.2; d lies between 0.6 and 1.1, preferably, d=0.9; and x lies between 8 and 10, preferably x=9~10.

According to a third aspect of the present invention, a method for forming an SBTN ferroelectric thin film on a substrate is provided. The SBTN thin film has a composition of $Sr_aBi_bTa_cNb_dO_x$, wherein a lies between 0.5 and 1, b lies between 2 and 2.7, c lies between 1 and 1.4, d lies between 0.6 and 1.1, and x lies between 8 and 10. The method according to the present invention includes steps of:

a) providing a first sputtering target formed of $Sr_eBi_fTa_gNb_hO_y$ above the substrate, wherein e lies between 0.5 and 1, f lies between 2 and 2.5, g lies between 1 and 2, h lies between 0.1 and 1, and y lies between 8 and 10;

b) providing a second sputtering target formed of $Bi_2O_3$ above the substrate; and c) providing a first and a second radio frequency (RF) powers for the first and the second sputtering targets, respectively and simultaneously, to release target components from the two sputtering targets, which form the SBTN thin film on the substrate.

In an embodiment, the first and the second sputtering targets have different angles with the substrate, e.g. 90 and 60 degrees, respectively. The first RF power is varied from a first value, e.g. 70 W, to a second value, 120 W, with an increment of a third value, e.g. 10 W, for each time, and the second RF power is fixed at a fourth value, e.g. 20 W.

Preferably, the method further includes a post-annealing step after the step c) to transform the crystalline phase of the SBTN film. The post-annealing step is performed at a temperature ranged between about 500° C. to about 700° C., more preferably about 598° C., a pressure selected from oxygen, nitrogen, argon and vacuum, and a pressure ranged between substantially 0 and about 10 mTorr within a period of time ranged between about 5 to about 60 minutes.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention directs to an SBTN ferroelectric thin film having a composition of $Sr_aBi_bTa_cNb_dO_x$, wherein a lies between 0.5 and 1, b lies between 2 and 2.7, c lies between 1 and 1.4, d lies between 0.6 and 1.1, and x lies between 8 and 10. Preferably, the SBTN ferroelectric thin film has a composition of $Sr_{0.8}Bi_{2.5}Ta_{1.2}Nb_{0.9}O_{9\sim10}$.

Figure 1:
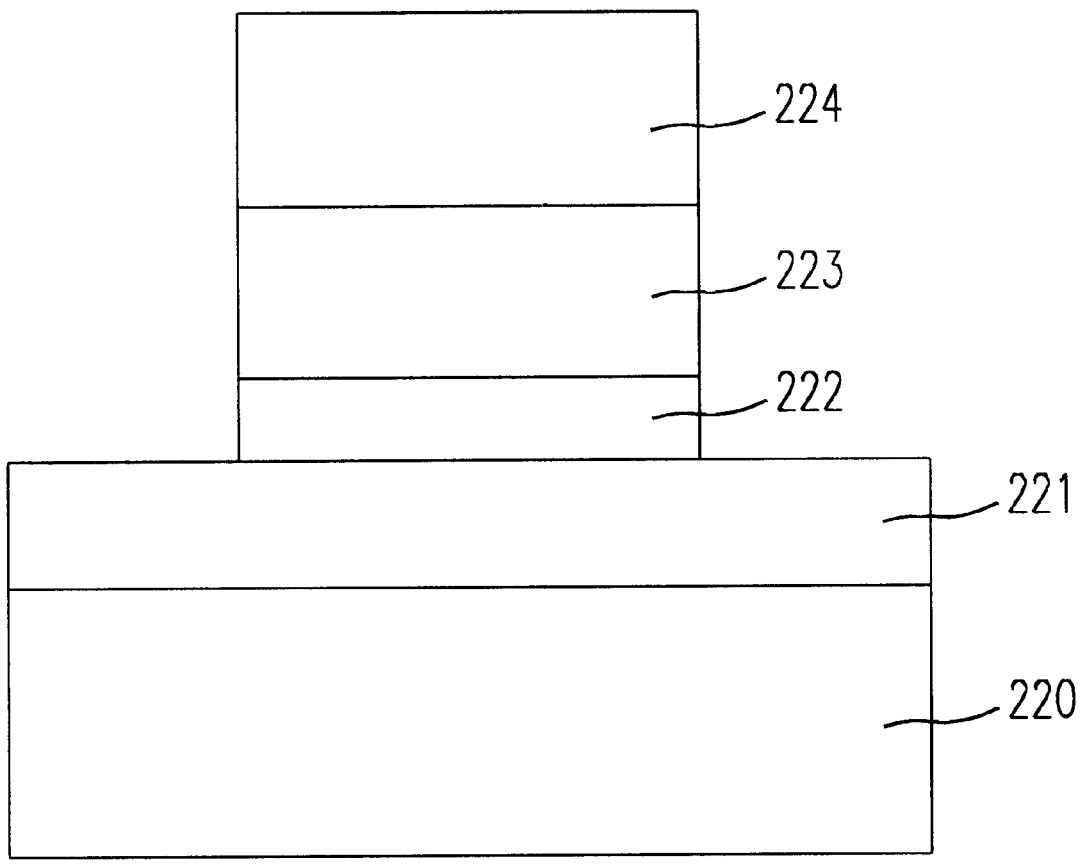
FIG. 1 is a schematic diagram of a capacitor structure using an SBTN ferroelectric thin film of the present invention as a dielectric layer.

The SBTN ferroelectric thin film mentioned above can be used in a capacitor included in a nonvolatile memory, as shown in FIG. 1. The numeral reference 220 indicates a silicon substrate, the numeral reference 221 indicates a silicon dioxide layer as an isolation layer, the numeral reference 222 indicates a bottom electrode, the numeral reference 223 indicates an SBTN thin film as a dielectric layer, and the numeral reference 224 indicates a top electrode. The silicon substrate 220 is cleaned first. Then, the silicon dioxide 221 of about 100 nm is deposited on the silicon substrate 220 by a thermal oxidation process, e.g. dry oxidation by oxygen at a temperature of about 900° C. or above. An Ir or Pt layer of about 100 nm is formed on the silicon dioxide 221 as the bottom electrode 222 by sputtering. The resulting $Pt/SiO_2/Si$ or $Ir/SiO_2/Si$ structure 20 is then applied thereonto the SBTN ferroelectric thin film 223 according to a process mentioned later. Then, the top electrode 224 is formed on the SBTN ferroelectric thin film 223 in a way similar to the bottom electrode 222.

Figure 2:
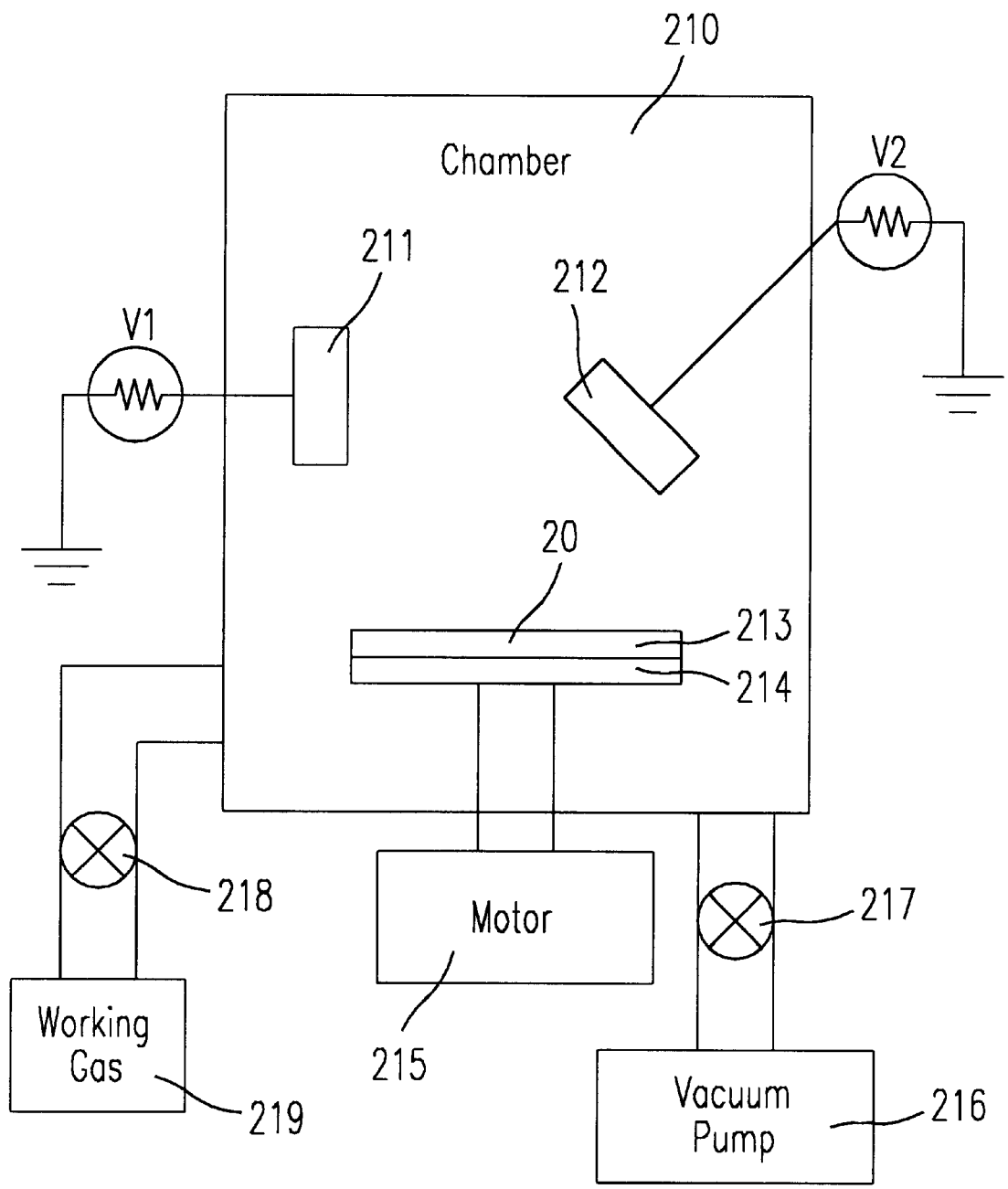
FIG. 2 is a schematic diagram of a sputtering system for depositing an SBTN ferroelectric thin film of the present invention on a substrate.

In order to apply the SBTN ferroelectric thin film 223 on the intermediate structure 20, a two-target off-axis RF magnetron sputtering process is performed as follows. Please refer to FIG. 2. The intermediate structure 20 is located in a substrate holder 213. A heater 214 is mounted below the substrate holder 213 for any required thermal treatment. The substrate holder 213 is rotated by a motor 215 to make the formation of the SBTN ferroelectric thin film 223 uniform. The working gas is provided by the device 219 which is controlled via a valve 218. The sputtering chamber 210 is evacuated by a vacuum pump 216 which is controlled via a valve 217. A first sputtering target 211 formed of $Sr_eBi_fTa_gNb_hO_y$, wherein e lies between 0.5 and 1, f lies between 2 and 2.5, g lies between 1 and 2, h lies between 0.1 and 1, and y lies between 8 and 10, and a second sputtering target 212 formed of $Bi_2O_3$ are provided as the two targets. The two sputtering targets are arranged at different angles relative to the substrate 20, and release respective target components to form the desired SBTN thin film.

The conditions and parameters of the sputtering process for forming the SBTN ferroelectric thin film includes that the first and the second sputtering targets 211 and 212 are. at 90 and 60 degrees relative to the substrate 20, respectively, the first RF power V1 is varied from 70 W to 120 W with an increment of 10 W, for each time; the second RF power V2 is fixed at 20 W; the deposition temperature is ranged between about 510° C. to about 630° C., preferably 570° C.; the working gas is an atmosphere of $O_2$ to $(Ar+O_2)$ gas pressure ratio ranged between 1% and 50%, preferably 40%; a constant chamber pressure is about 20 mTorr; and he total sputtering time is ranged between about 100 to about 240 minutes, preferably 180 minutes. Afterwards, a post-annealing step after sputtering is performed to transform the crystalline phase of the SBTN film to a desired one. The post-annealing step is performed at a temperature ranged between about 500° C. to about 700° C., preferably 598° C., an atmosphere selected from oxygen, nitrogen and argon with a pressure less than about 10 mTorr or vacuum within a period of time ranged between about 5 to about 60 minutes, preferably 30 minutes.

When an $Sr_{0.8}Bi_{2.5}Ta_{1.2}Nb_{0.9}O_{9\sim10}$ film of about 400 nm is formed as the dielectric layer 223 of FIG. 1, it exhibits the properties of a dielectric constant of about 752, loss tangent of 0.035 at 100 kHz, leakage current density of $6\times10^{-6}$ $A/cm^2$ at an electric field of 50 kV/cm with a delay time of 30 sec, remanent polarization ($2P_r$) of 40 $\mu C/cm^2$ and coercive field (2Ec) of 77 kV/cm at an applied voltage of 3 V. According to the investigation on the ten-year lifetime of time-dependent dielectric breakdown (TDDB), the resulting SBTN film has a longer lifetime over 10 years on the condition of normal operation. The SBTN film demonstrates fatigue free characteristics up to $10^{11}$ switching cycles under a 3 V bipolar 1 MHz square wave. Moreover, the polarization dispersion of this film is as low as 0.5% per decade or less after 240 minutes, which is comparable with PZT.

By the way, the first sputtering target is preferably formed of $Sr_{0.8}Bi_{2.2}Ta_{1.2}Nb_{0.8}O_9$ corresponding to the formed $Sr_{0.8}Bi_{2.2}Ta_{1.2}Nb_{0.9}O_{9\sim10}$ film. The $Sr_{0.8}Bi_{2.2}Ta_{1.2}Nb_{0.8}O_9$ target should exhibit high density, high mechanical strength and proper crystalline phase. Therefore, the $Sr_{0.8}Bi_{2.2}Ta_{1.2}Nb_{0.8}O_9$ target can be produced as follows.

The targets are prepared by a solid-state reaction process. The ceramic powders of $Bi_2O_3$ (99.99%): $Ta_2O_5$ (99.9%): $Nb_2O_5$ (99.9%):$Sr(OH)_2.8H_2O$ (99.9%) are mixed in ratio of Bi:Ta:Nb:Sr=2.2:1.2:0.8:0.8 is provided. The mixture of $Bi_2O_3$, $Ta_2O_5$ and $Nb_2O_5$ is dry ground for 22~26 hours, preferably 24 hours. $Sr(OH)_2.8H_2O$ and alcohol are added to the mixture of $Bi_2O_3$, $Ta_2O_5$ and $Nb_2O_5$, and wet ground for 43–53 hours, preferably 48 hours. The mixture is heated at 70–90° C. for 1–3 hour(s), preferably at 80° C. for 2 hours, to evaporate the alcohol. Afterwards, the mixture is fired at a temperature of about 550–650° C. within a period of time of about 5–7 hours, preferably at 600° C. for 6 hours, to obtain a powder mixture. The powder is further ground, and then, another firing step is performed at a temperature of about 700–900° C. within a period of time of about 5–7 hours preferably at 800° C. for 6 hours. Subsequently, a ball milling step is performed in a suitable container such as a polyethylene (PE) container for 22–26 hours, preferably 24 hours. A binder such as polyvinyl alcohol (PVA) is added and then press molded into a plate. The plate is densified by a 3-step firing process including a first firing step performed at a temperature of about 450–550° C. within a period of time of about 5–7 hours, a second firing step performed at a temperature of about 630–770° C. within a period of time of about 5–7 hours, and a third firing step, which is a sintering step, performed at a temperature of about 1100–1300° C. within a period of time of about 0.5–1.5 hours. Preferably, the first firing step is performed at a temperature of about 500° C. within a period of time of about 6 hours, the second firing step is performed at a temperature of about 700° C. within a period of time of about 6 hours, and the third firing step is performed at a temperature of about 1200° C. within a period of time of about 1 hour, and the 3-step firing process is a continuous process with a heating-up rate of about 10° C./min.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming an SBTN ferroelectic till film on a substrate, said SBTN thin film having a composition of $Sr_aBi_bTa_cNb_dO_x$, wherein a lies between 0.5 and 1, b lies between 2 and 2.7, c lies between 1 and 1.4, d lies between 0.6 and 1.1, and x lies between 8 and 10, and said method comprising steps of:

a) providing a first sputtering target formed of $Sr_eBi_fTa_gNb_hO_y$ above said substrate, wherein e ties between 0.5 and 1, f lies between 2 and 2.5, g lies between 1 and 1.4, h lies between 0.6 and 1.1, and y lies between 8 and 10;

b) providing a second sputtering target formed of $Bi_2O_3$ above said substrate; and c) providing a first and a second radio frequency (RF) powers for said first and said second sputterng targets, respectively and simultaneously, to release target components from said two sputtering targets, which farm said SBTN thin film on said substrate, wherein said first and said second sputtering targets have different angles with respect to said substrate.

2. The method according to claim 1 wherein a first angle between said first sputtering target and said substrate is larger than a second angle between said second spattering target and said substrate.

3. The method according to claim 2 wherein said first RF power is varied from a first value to a second value with an increment of a third value for each time, and said second RF power is fixed at a fourth value.

4. The method according to claim 3 wherein said first angle is about 90 degrees, said second angle is about 60 degrees, said first value is about 70 W, said second value is about 120 W, said third value is about 10 W, and said fourth value is about 20 W.

5. The method according to claim 1, wherein in said step c), said SBTN film is formed at a temperature ranged between about 510° C. to about 630° C., an atmosphere of $O_2$ to $(Ar+O_2)$ gas pressure ratio ranged between 1% and 50%, and a constant chamber pressure of about 20 mTorr within a period of time ranged between about 100 to about 240 minutes.

6. The method according to claim 5 wherein in said step c), said SBTN film is formed at a temperature of about 570° C., an atmosphere of $O_2$ to $(Ar+O_2)$ gas pressure ratio of about 40%, and a constant chamber pressure of about 20 mTorr within a period of time of about 180 minutes.

7. The method according to claim, 1 further comprising a post-annealing step after said step c) to transform the crystalline phase of said SBTN film.

8. The method according to claim 7 wherein said post-annealing step is performed at a temperature ranged between about 500° C. to about 700° C., an atmosphere selected from oxygen, nitrogen, argon and vacuum, and a pressure ranged between substantially 0 and about 10 mTorr within a period of time ranged between about 5 to about 60 minutes.

9. The method according to claim 8 wherein said post-annealing step is performed at a temperature of about 598° C., and a pressure of about 10 mTorr within a period of tine of about 30 minutes.

10. The method according to claim 1 wherein in said step a), said first sputtering target is formed of an $Sr_eBi_fTa_gNb_hO_y$ thin film which is processed by a 3-step firing process, which comprises:

a first firing step performed at a temperature of about 450–550° C. within a period of time of about 5–7 hours;

a second firing step performed at a temperature of about 630–770° C. within a period of time of about 5–7 hours, and;

a third firing step performed at a temperature of about 1100–1300° C. within a period of time of about 0.5–1.5 hours.

11. The method according to claim 10 wherein said first firing step is performed at a temperature of about 500° C. within a period of time of about 6 hours, said second firing step is performed at a temperature of about 700° C. within a period of time of about 6 hours, and said third firing step is performed at a temperature of about 1200° C. within a period of time of about 1 hour.

12. The method according to claim 11 wherein said 3-step firing process is a continuous process with a heating-up rate of about 10° C./min.

13. The method according to claim 10 wherein said $Sr_eBi_fTa_gNb_hO_y$ thin film includes components of $Bi_2O_3$, $Ta_2O_5$, $Nb_2O_5$ and $Sr(OH)_2.8H_2O$.

* * * * *

UNITED STATES PATENT AND TRADEMARK OFFICE
CERTIFICATE OF CORRECTION

PATENT NO.    : 6,503,374 B1
DATED         : January 7, 2003
INVENTOR(S)   : Tseng et al.

It is certified that error appears in the above-identified patent and that said Letters Patent is hereby corrected as shown below:

Column 5,
Line 15, "ferroelectic" should read -- ferroelectric --;
Line 15, "till" should read -- thin --;
Line 22, "ties" should read -- lies --;
Line 29, "sputterng" should read -- sputtering --;
Line 31, "farm" should read -- form --;
Line 37, "spattering" should read -- sputtering --.

Column 6,
Line 21, "tine" should read -- time --.

Signed and Sealed this

Twenty-fifth Day of March, 2003

JAMES E. ROGAN
*Director of the United States Patent and Trademark Office*